(12) United States Patent
Loboda et al.

(10) Patent No.: US 9,165,779 B2
(45) Date of Patent: Oct. 20, 2015

(54) FLAT SIC SEMICONDUCTOR SUBSTRATE

(71) Applicant: Dow Corning Corporation, Midland, MI (US)

(72) Inventors: Mark Loboda, Bay City, MI (US); Christopher Parfeniuk, Midland, MI (US)

(73) Assignee: DOW CORNING CORPORATION, Midland, MI (US)

( * ) Notice: Subject to any disclaimer, the term of this patent is extended or adjusted under 35 U.S.C. 154(b) by 0 days.

(21) Appl. No.: 14/644,980

(22) Filed: Mar. 11, 2015

(65) Prior Publication Data

US 2015/0194319 A1 Jul. 9, 2015

Related U.S. Application Data

(62) Division of application No. 13/959,896, filed on Aug. 6, 2013, now Pat. No. 9,018,639.

(60) Provisional application No. 61/719,310, filed on Oct. 26, 2012.

(51) Int. Cl.
| | |
|---|---|
| *H01L 29/15* | (2006.01) |
| *H01L 21/306* | (2006.01) |
| *H01L 21/02* | (2006.01) |
| *H01L 29/16* | (2006.01) |

(52) U.S. Cl.
CPC .... *H01L 21/30625* (2013.01); *H01L 21/02013* (2013.01); *H01L 21/02019* (2013.01); *H01L 21/02021* (2013.01); *H01L 21/02035* (2013.01); *H01L 29/1608* (2013.01)

(58) Field of Classification Search
CPC .................................................. H01L 29/1605
USPC ............................................ 257/77; 438/765
See application file for complete search history.

(56) References Cited

U.S. PATENT DOCUMENTS

| 2,854,364 A | 9/1958 | Lely | |
|---|---|---|---|
| 3,691,694 A * | 9/1972 | Goetz et al. | .................... 451/269 |

(Continued)

FOREIGN PATENT DOCUMENTS

| CN | 643188 | 7/2005 |
|---|---|---|
| CN | 1020090031573 | 3/2009 |

(Continued)

OTHER PUBLICATIONS

Chen, Y., et al. "Studies of the Distribution of Elementary Threading Screw Dislocations in 4H Silicon Carbide Wafer." Materials Science Forum 600-603 (2007): 301-304.

(Continued)

*Primary Examiner* — Nicholas Tobergte
(74) *Attorney, Agent, or Firm* — Nixon Peabody LLP; Joseph Bach, Esq.

(57) ABSTRACT

Methods for manufacturing silicon carbide wafers having superior specifications for bow, warp, total thickness variation (TTV), local thickness variation (LTV), and site front side least squares focal plane range (SFQR). The resulting SiC wafer has a mirror-like surface that is fit for epitaxial deposition of SiC. The specifications for bow, warp, total thickness variation (TTV), local thickness variation (LTV), and site front side least squares focal plane range (SFQR) of the wafer are preserved following the addition of the epitaxy layer.

14 Claims, 1 Drawing Sheet

(56) References Cited

U.S. PATENT DOCUMENTS

| | | | |
|---|---|---|---|
| 4,582,561 A * | 4/1986 | Ioku et al. | 117/56 |
| 4,855,254 A * | 8/1989 | Eshita et al. | 117/94 |
| 4,866,005 A * | 9/1989 | Davis et al. | 117/98 |
| 4,912,063 A * | 3/1990 | Davis et al. | 117/97 |
| 4,912,064 A * | 3/1990 | Kong et al. | 438/507 |
| 5,679,153 A * | 10/1997 | Dmitriev et al. | 117/106 |
| 5,709,745 A * | 1/1998 | Larkin et al. | 117/96 |
| 5,888,887 A * | 3/1999 | Li et al. | 438/525 |
| 5,895,583 A * | 4/1999 | Augustine et al. | 216/53 |
| 5,899,743 A * | 5/1999 | Kai et al. | 438/690 |
| 5,942,445 A * | 8/1999 | Kato et al. | 438/691 |
| 5,944,890 A * | 8/1999 | Kitou et al. | 117/101 |
| 5,954,881 A * | 9/1999 | Burk et al. | 118/715 |
| 6,196,901 B1 * | 3/2001 | Minami | 451/63 |
| 6,352,927 B2 * | 3/2002 | Kishimoto | 438/690 |
| 6,491,836 B1 * | 12/2002 | Kato et al. | 216/88 |
| 6,534,026 B2 * | 3/2003 | Vodakov et al. | 423/345 |
| 6,562,127 B1 * | 5/2003 | Kud et al. | 117/94 |
| 6,579,359 B1 * | 6/2003 | Mynbaeva et al. | 117/94 |
| 6,583,050 B2 * | 6/2003 | Wenski et al. | 438/626 |
| 6,723,166 B2 * | 4/2004 | Kuhn et al. | 117/200 |
| 6,827,638 B2 * | 12/2004 | Kiuchi et al. | 451/287 |
| 6,861,360 B2 * | 3/2005 | Wenski et al. | 438/693 |
| 6,899,762 B2 | 5/2005 | Wenski et al. | |
| 7,081,420 B2 * | 7/2006 | Kamata et al. | 438/778 |
| 7,294,324 B2 * | 11/2007 | Powell et al. | 423/328.2 |
| 7,314,520 B2 * | 1/2008 | Powell et al. | 117/109 |
| 7,314,521 B2 * | 1/2008 | Powell et al. | 117/109 |
| 7,316,747 B2 * | 1/2008 | Jenny et al. | 117/86 |
| 7,323,051 B2 * | 1/2008 | Hobgood et al. | 117/109 |
| 7,399,217 B1 * | 7/2008 | Godshall | 451/11 |
| 7,422,634 B2 * | 9/2008 | Powell et al. | 117/200 |
| 7,438,760 B2 | 10/2008 | Bauer et al. | |
| 7,449,065 B1 * | 11/2008 | Powell et al. | 117/84 |
| 7,513,819 B2 | 4/2009 | Kiuchi et al. | |
| 7,531,433 B2 * | 5/2009 | Ellison et al. | 438/478 |
| 7,935,614 B2 * | 5/2011 | Schauer et al. | 438/478 |
| 8,075,647 B2 * | 12/2011 | Kawasaki et al. | 51/307 |
| 8,165,706 B2 * | 4/2012 | Pitney | 700/110 |
| 8,221,549 B2 * | 7/2012 | Maruyama | 117/104 |
| 8,384,090 B2 | 2/2013 | Powell et al. | |
| 8,395,164 B2 * | 3/2013 | Murphy et al. | 257/77 |
| 8,435,866 B2 * | 5/2013 | Nishiguchi et al. | 438/458 |
| 8,436,366 B2 * | 5/2013 | Harada et al. | 257/77 |
| 8,716,718 B2 * | 5/2014 | Momose et al. | 257/77 |
| 8,860,040 B2 | 10/2014 | Loboda et al. | |
| 2002/0083892 A1 | 7/2002 | Kondo et al. | |
| 2003/0070611 A1 | 4/2003 | Nakamura et al. | |
| 2004/0081805 A1 | 4/2004 | Furihata et al. | |
| 2004/0134418 A1 | 7/2004 | Hirooka | |
| 2004/0266057 A1 | 12/2004 | Nagasawa | |
| 2005/0059247 A1 | 3/2005 | Ikenaka | |
| 2006/0102068 A1 | 5/2006 | Tsvetkov et al. | |
| 2006/0107890 A1 | 5/2006 | Hobgood et al. | |
| 2006/0118037 A1 | 6/2006 | Powell et al. | |
| 2006/0249073 A1 | 11/2006 | Asaoka et al. | |
| 2006/0267024 A1 | 11/2006 | Murphy et al. | |
| 2006/0289873 A1 | 12/2006 | Rowland et al. | |
| 2007/0176531 A1 | 8/2007 | Kinoshita et al. | |
| 2007/0221614 A1 | 9/2007 | Sumakeris | |
| 2007/0262322 A1 | 11/2007 | Nakabayashi et al. | |
| 2007/0290211 A1 | 12/2007 | Nakayama et al. | |
| 2008/0008641 A1 | 1/2008 | Leonard et al. | |
| 2008/0217627 A1 | 9/2008 | Friedrichs et al. | |
| 2008/0220620 A1 | 9/2008 | Kawada et al. | |
| 2008/0261401 A1 | 10/2008 | Kerr et al. | |
| 2008/0318359 A1 | 12/2008 | Yonezawa et al. | |
| 2009/0038541 A1 | 2/2009 | Robbins et al. | |
| 2009/0085044 A1 | 4/2009 | Ohno et al. | |
| 2009/0114148 A1 | 5/2009 | Stahlbush et al. | |
| 2009/0124060 A1 | 5/2009 | Nagaya et al. | |
| 2009/0134405 A1 | 5/2009 | Ota et al. | |
| 2009/0302328 A1 | 12/2009 | Ohno et al. | |
| 2009/0321747 A1 | 12/2009 | Murphy et al. | |
| 2009/0324896 A1 | 12/2009 | Kato | |
| 2010/0080956 A1 | 4/2010 | Fujimoto et al. | |
| 2010/0119849 A1 | 5/2010 | Nakamura et al. | |
| 2010/0291756 A1 | 11/2010 | Haeberlen et al. | |
| 2010/0295059 A1 | 11/2010 | Fujimoto et al. | |
| 2011/0031505 A1 | 2/2011 | Harada et al. | |
| 2011/0206929 A1 | 8/2011 | Nakabayashi et al. | |
| 2011/0233562 A1 | 9/2011 | Harada et al. | |
| 2011/0237078 A1 | 9/2011 | Hirooka | |
| 2011/0284871 A1 | 11/2011 | Harada et al. | |
| 2012/0025153 A1 | 2/2012 | Hirose et al. | |
| 2012/0031330 A1 | 2/2012 | Tsumori et al. | |
| 2012/0060751 A1 | 3/2012 | Urakami et al. | |
| 2012/0061686 A1 | 3/2012 | Nishiguchi et al. | |
| 2012/0070605 A1 | 3/2012 | Sasaki et al. | |
| 2012/0070968 A1 | 3/2012 | Shibagaki et al. | |
| 2012/0103249 A1 | 5/2012 | Gupta et al. | |
| 2012/0128892 A1 | 5/2012 | Toyoda et al. | |
| 2012/0184113 A1 | 7/2012 | Inoue et al. | |
| 2012/0241766 A1 | 9/2012 | Ohtsuka et al. | |
| 2012/0248463 A1 | 10/2012 | Zhang | |
| 2012/0280254 A1 | 11/2012 | Muto et al. | |
| 2012/0285370 A1 | 11/2012 | Gupta et al. | |
| 2013/0020585 A1 | 1/2013 | Ishibashi | |
| 2013/0029158 A1 | 1/2013 | Aigo et al. | |
| 2013/0032822 A1 | 2/2013 | Ishibashi | |
| 2013/0071643 A1 | 3/2013 | Harada et al. | |
| 2013/0099253 A1 | 4/2013 | Ohtsuka et al. | |
| 2013/0122692 A1 | 5/2013 | Imai et al. | |
| 2013/0126906 A1 | 5/2013 | Tomita et al. | |
| 2014/0054609 A1 | 2/2014 | Burk et al. | |

FOREIGN PATENT DOCUMENTS

| | | |
|---|---|---|
| CN | 101490315 | 7/2009 |
| CN | 101724344 | 6/2010 |
| CN | 102107391 | 6/2011 |
| CN | 102569055 | 7/2012 |
| CN | 102899723 | 1/2013 |
| DK | DE 102009016132 | 10/2010 |
| EP | 0712150 | 5/1996 |
| EP | 0795050 | 7/1999 |
| EP | 0967304 | 12/1999 |
| EP | 1039512 | 3/2000 |
| EP | 1179620 | 2/2002 |
| EP | 0954623 | 5/2002 |
| EP | 1215730 | 6/2002 |
| EP | 1225257 | 7/2002 |
| EP | 1288346 | 8/2002 |
| EP | 1255281 | 11/2002 |
| EP | 1306890 | 5/2003 |
| EP | 1354987 | 10/2003 |
| EP | 1403404 | 3/2004 |
| EP | 1143033 | 9/2004 |
| EP | 1491662 | 12/2004 |
| EP | 1243674 | 6/2005 |
| EP | 1659198 | 5/2006 |
| EP | 1739726 | 1/2007 |
| EP | 1785512 | 5/2007 |
| EP | 1852527 | 11/2007 |
| EP | 1855312 | 11/2007 |
| EP | 1751329 | 1/2008 |
| EP | 1901345 | 3/2008 |
| EP | 1828446 | 3/2010 |
| EP | 1721031 | 11/2010 |
| EP | 2264223 | 12/2010 |
| EP | 2314737 | 4/2011 |
| EP | 1752567 | 9/2011 |
| EP | 2371997 | 10/2011 |
| EP | 2385158 | 11/2011 |
| EP | 2394787 | 12/2011 |
| EP | 2395133 | 12/2011 |
| EP | 2405038 | 1/2012 |
| EP | 2420599 | 2/2012 |
| EP | 2484815 | 8/2012 |
| EP | 2490247 | 8/2012 |
| EP | 2557205 | 2/2013 |
| EP | 1797225 | 3/2013 |
| EP | 2570522 | 3/2013 |
| EP | 2584594 | 4/2013 |

(56) References Cited

FOREIGN PATENT DOCUMENTS

| | | |
|---|---|---|
| EP | 1790757 | 8/2013 |
| JP | H05-262599 | 10/1993 |
| JP | H06-316499 | 11/1994 |
| JP | 11-121311 A | 4/1999 |
| JP | 11-135464 A | 5/1999 |
| JP | 2001-508597 A | 6/2001 |
| JP | 2003086518 | 3/2003 |
| JP | 2003086816 | 3/2003 |
| JP | 2003-249426 A | 9/2003 |
| JP | 2004099340 | 4/2004 |
| JP | 2004-299018 A | 10/2004 |
| JP | 2004292305 | 10/2004 |
| JP | 2005051299 | 2/2005 |
| JP | 2005064392 | 3/2005 |
| JP | 2006066722 | 3/2006 |
| JP | 2006120897 | 5/2006 |
| JP | 2006-245128 A | 9/2006 |
| JP | 2007-2268 A | 1/2007 |
| JP | 2007080770 | 3/2007 |
| JP | 2007131504 | 5/2007 |
| JP | 2007230823 | 9/2007 |
| JP | 2008001537 | 1/2008 |
| JP | 2008004888 | 1/2008 |
| JP | 2008-53178 A | 3/2008 |
| JP | 2008053343 | 3/2008 |
| JP | 2008-74664 1 | 4/2008 |
| JP | 2008-91656 A | 4/2008 |
| JP | 2008074661 | 4/2008 |
| JP | 2008115034 | 5/2008 |
| JP | 2009182126 | 8/2009 |
| JP | 2009-256146 A | 11/2009 |
| JP | 2010-29995 A | 2/2010 |
| JP | 2010-45279 A | 2/2010 |
| JP | 2010135789 | 6/2010 |
| JP | 2010228939 | 10/2010 |
| JP | 2010-254521 A | 11/2010 |
| JP | 2010254520 | 11/2010 |
| JP | 2011020860 | 2/2011 |
| JP | 2011073915 | 4/2011 |
| JP | 2011-121847 A | 6/2011 |
| JP | 2011-122102 A | 6/2011 |
| JP | 2011-219297 A | 11/2011 |
| JP | 2011233932 | 11/2011 |
| JP | 2011243619 | 12/2011 |
| JP | 2011254119 | 12/2011 |
| JP | 2012028565 | 2/2012 |
| JP | 2012-51795 A | 3/2012 |
| JP | 2012-114210 A | 6/2012 |
| JP | 2012246168 | 12/2012 |
| JP | 2013014469 | 1/2013 |
| KR | 10-2004-0097175 A | 11/2004 |
| KR | 10-2008-0007165 A | 1/2008 |
| KR | 100845946 | 7/2008 |
| KR | 10-2010-0096999 A | 9/2010 |
| KR | 10-2012-0061920 A | 6/2012 |
| KR | 10-2012-0101087 A | 9/2012 |
| KR | 10-2012-0101097 A | 9/2012 |
| WO | WO 9301914 | 2/1993 |
| WO | WO 9713013 | 4/1997 |
| WO | WO 0068474 | 11/2000 |
| WO | WO 0079570 | 12/2000 |
| WO | WO 0218670 | 3/2002 |
| WO | WO 2004014607 | 2/2004 |
| WO | WO 2005111277 | 11/2005 |
| WO | WO 2006031641 | 3/2006 |
| WO | WO 2006108191 | 10/2006 |
| WO | WO 2006135476 | 12/2006 |
| WO | WO 2007035570 | 3/2007 |
| WO | WO 2007058774 | 5/2007 |
| WO | WO 2007148486 | 12/2007 |
| WO | WO 2008033994 | 3/2008 |
| WO | WO 2008039914 | 4/2008 |
| WO | WO 2009003100 | 12/2008 |
| WO | 2009/035095 A1 | 3/2009 |
| WO | WO 2009075935 | 6/2009 |
| WO | WO 2009080177 | 7/2009 |
| WO | WO 2009120505 | 10/2009 |
| WO | WO 2010041497 | 4/2010 |
| WO | WO 2010111473 | 9/2010 |
| WO | WO2010119792 | 10/2010 |
| WO | WO 2011034850 | 3/2011 |
| WO | WO 2011083552 | 7/2011 |
| WO | WO 2011126145 | 10/2011 |
| WO | WO 2011/142074 | 11/2011 |
| WO | WO 2011149906 | 12/2011 |
| WO | WO 2012026234 | 3/2012 |
| WO | WO 2012067112 | 5/2012 |
| WO | WO 2012144614 | 10/2012 |
| WO | WO 2013062380 | 5/2013 |

OTHER PUBLICATIONS

Chung, G., et al. "4H—SiC Epitaxy with Very Smooth Surface and Low Basal Plane Dislocation on 4 Degree Off-Axis Wafer." Materials Science Forum 679-680 (2011): 123-126.

Dmitriev, V., et al. "Growth of SiC and SiC—AlN solid solution by container-free liquid phase epitaxy." Journal of crystal growth 128.1 (1993): 343-348.

Gupta, A., et al. "Status of Large Diameter SiC Single Crystals." Materials Science Forum 717-720 (2012): 3-8.

Gutkin, M., et al. "Micropipe Reactions in Bulk SiC Growth." Silicon Carbide—Materials, Processing and Applications in Electronic Devices (2011): 187-206.

Hecht, C., et al. "High-Performance Multi-Wafer SiC Epitaxy—First Results of Using a 10×100mm Reactor." Materials Science Forum 645-648 (2010): 89-94.

Hull, B., et al., "Development of Large Area (up to 1.5 cm2) 4H—SiC 10 kV Junction Barrier Schottky Rectifiers." Materials Science Forum 600-603 (2008): 931-934.

Ioffe Physico-Technical Institute. "Electronic archive. New Semiconductor Materials. Characteristics and Properties. NSM Archive—Silicon Carbide (SiC)." http://www.ioffe.ru/SVA/NSM/Semicond/ accessed Aug. 29, 2013 (1998-2001): 1-72.

Kimoto, T., et al. "Homoepitaxial growth of 4H—SiC (033¯8) and nitrogen doping by chemical vapor deposition." Journal of crystal growth 249.1 (2003): 208-215.

Larkin, D., et al. "Site-competition epitaxy for superior silicon carbide electronics." Applied Physics Letters 65.13 (1994): 1659-1661.

Lendenmann, H., et al. "Operation of a 2500V 150A Si-IGBT / SiC Diode Module." Materials Science Forum 338-342 (2000): 1423-1426.

Maximenko, S., et al. "Open core dislocations and surface energy of SiC." Materials Science Forum 527-529 (2006): 439-442.

Mynbaeva, M., et al. "Chemical vapor deposition of 4H—SiC epitaxial layers on porous SiC substrates." Applied Physics Letters 78.1 (2001): 117-119.

Neudeck, P. "Electrical impact of SiC structural crystal defects on high electric field devices." Materials Science Forum 338-342 (2000): 1161-1166.

Neudeck, P., et al. "Performance limiting micropipe defects in silicon carbide wafers." Electron Device Letters, IEEE 15.2 (1994): 63-65.

Ogunniyi, A., et al. "The benefits and current progress of SiC SGTOs for pulsed power applications." Solid-State Electronics 54.10 (2010): 1232-1237.

Powell, A., et al. "Large Diameter 4H—SiC Substrates for Commercial Power Applications." Materials Science Forum 457-460 (2004): 41-46.

Powell, J., et al. "Process-Induced Morphological Defects in Epitaxial CVD Silicon Carbide." physica status solidi (b) 202.1 (1997): 529-548.

Powell, J., et al. "Sources of Morphological Defects in SiC Epilayers." Transactions Third International High-Temperature Electronics Conference, Sandia National Laboratories 1 (1996): II-3-II-8.

Sanchez, E., et al. "Thermal decomposition cavities in physical vapor transport grown SiC." Materials Science Forum 338.1 (2000): 55.58.

Schulze, N., et al. "Near-equilibrium growth of micropipe-free 6H—SiC single crystals by physical vapor transport." Applied Physics Letters 72.13 (1998): 1632-1634.

(56) References Cited

OTHER PUBLICATIONS

Tairov, Y., et al. "General principles of growing large-size single crystals of various silicon carbide polytypes." Journal of Crystal Growth 52 (1981): 146-150.

Tairov, Y., et al. "Progress in controlling the growth of polytypic crystals." Progress in Crystal Growth and Characterization 7.1 (1983): 111-162.

Thomas, B., et al. "Properties and suitability of 4H—SiC epitaxial layers grown at different CVD systems for high voltage applications." Materials Science Forum 457-460 (2004): 181-184.

Tupitsyn, E., et al. "Controllable 6H—SiC to 4H—SiC polytype transformation during PVT growth." Journal of Crystal Growth 299.1 (2007): 70-76.

Wagner, G., et al. "Vapour phase growth of epitaxial silicon carbide layers." Progress in crystal growth and characterization of materials 47.2 (2003): 139-165.

Wan, J., et al. "A comparative study of micropipe decoration and counting in conductive and semi-insulating silicon carbide wafers." Journal of Electronic Materials. 34.10 (2005): 1342-1348.

Wan, J., et al. "A New Method of Mapping and Counting Micropipes in SiC Wafers." Materials Science Forum 527-529 (2006): 447-450.

Wan, J., et al. "Scaling of chiorosilane SiC CVD to multi-wafer epitaxy system." Materials Science Forum 556-557 (2007): 145-148.

Wolf, S., et al. Silicon Processing for the VLSI Era. vol. 1—Process Technology. Ch. 1: Silicon: Single-Crystal Growth and Wafering (1986): 1-35.

Zhou, L., et al. "Chemomechanical polishing of silicon carbide." Journal of the Electrochemical Society 144.6 (1997): L161-L163.

Levinshtein, M., et al. (eds.). Properties of Advanced Semiconductor Materials: GaN, AlN, InN, BN, SiC, SiGe. Ch. 5: Silicon Carbide (SiC) (2001): 93-147.

International Application No. PCT/US2013/059064, International Search Report and Written Opinion, Nov. 18, 2013.

Yashiro, H., et al. "Development of Lapping and Polishing Technologies of 4H—SiC Wafers for Power Device Applications." Materials Science Forum 600-603 (2009): 819-822.

International Application No. PCT/US2013/058996, International Search Report and Written Opinion, Nov. 27, 2013.

International Application No. PCT/US2013/077189, International Search Report and Written Opinion, Mar. 21, 2014.

Chen, W., and M. A. Capano. "Growth and characterization of 4H—SiC epilayers on substrates with different off-cut angles." Journal of applied physics 98.11 (2005): 114907.

International Application No. PCT/US2013/077285, International Search Report and Written Opinion, Apr. 7, 2014.

International Application No. PCT/US2013/077291, International Search Report and Written Opinion, Apr. 4, 2014.

Kordina et al., "SiC epitaxial growth on larger area substrates: History and evolution", Silicon Carbide Epitaxy, 2012, pp. 1-25.

Myers R L et al.: "High epitaxial growth rate of 4H—Sic using Horizontal hot-wall CVD".

Office Action for Japanese Patent Application No. 2015-523311 dated Jul. 21, 2015.

Office Action for Korean Patent Application No. 10-2015-7013789 dated Jul. 27, 2015.

\* cited by examiner

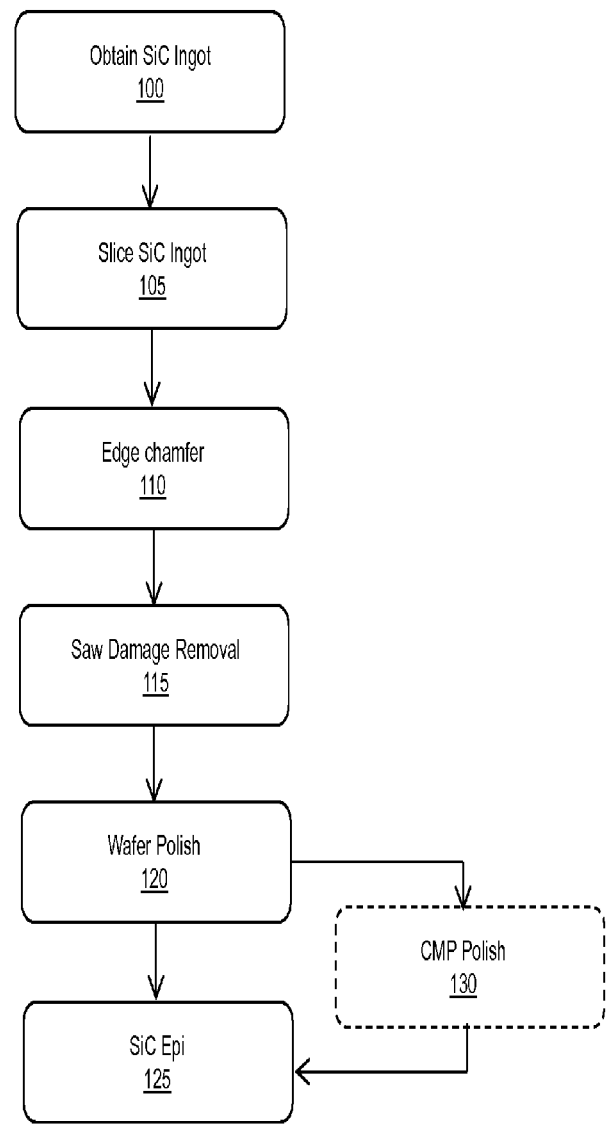

FLAT SIC SEMICONDUCTOR SUBSTRATE

CROSS-REFERENCE TO RELATED APPLICATIONS

This application is a divisional of U.S. patent application Ser. No. 13/959,896 filed Aug. 6, 2013 which claims the benefit of, and priority to, U.S. Provisional Patent Application No. 61/719,310, filed on Oct. 26, 2012, entitled "FLAT SIC SEMICONDUCTOR SUBSTRATE," the entire disclosure of which is hereby incorporated herein by reference.

BACKGROUND

1. Field

This disclosure relates to fabrication of semiconductor wafers and, more specifically, to semiconductor wafers made of silicon carbide.

2. Related Arts

The semiconductor chip industry owes much of its success to the natural properties of silicon. These properties include the ease of growing native oxide ($SiO_2$), the excellent insulating properties of its native oxide, and the relative ease of fabrication of silicon wafers and devices within the silicon wafers. For example, silicon and its native oxide are easily etched using either wet or dry plasma etch processes. Consequently, many processes have been developed for fabrication of highly pure (99.9999999% pure), monocrystalline, and relatively large (300 mm, with preparation underway for 450 mm) silicon wafers. Silicon wafers are the primary material used in the fabrication of chips for computing and power electronics.

Other materials, such as, e.g., Sapphire, GaN (Gallium Nitride), AlN (Aluminum Nitride) and SiC (silicon carbide), exhibit properties useful in fabrication of semiconductor devices such as detectors, light emitters and power devices; however, to date their adoption in main-stream fabrication has been hampered due to the difficulties in their fabrication. Generally, standard silicon processes cannot be implemented when working with these other semiconductor materials. For example, while pure monocrystalline silicon can be easily grown using the Czochralski growth method, such a growth method cannot be used for growing SiC. Instead, a high temperature sublimation method must be employed. Similarly, since SiC cannot be easily etched, standard silicon wafering techniques cannot be easily employed for wafering SiC.

On the other hand, high-temperature/high-voltage semiconductor electronics can benefit from the natural properties of SiC. For example, SiC is used for ultrafast, high-voltage Schottky diodes, MOSFETs and high-temperature thyristors for high-power switching, and high power LEDs. Therefore, increasing the availability of SiC can contribute to the development of such semiconductor devices. For example, current production of 100 mm SiC wafers lags far behind the standard 300 mm silicon wafer.

Additionally, in single crystal silicon carbide, complex doping profiles in transistors and diodes cannot be reliably formed by diffusion. Complex geometrical doping configurations must be accomplished using ion implantation thru micron/submicron geometry masks formed using stepper-based photolithographic methods. In order to realize the required implantation for the targeted dopant incorporation within the semiconductor, flat substrates must be used in the photolithographic process, especially as the geometric size of the device increases.

Generally, semiconductor substrates are characterized by several metrics when being assessed for flatness and roughness. These metrics include bow, warp, total thickness variation (TTV or Global Backside Indicated Reading—GBIR), local thickness variation (LTV or Site Backsurface-referenced Ideal Plane/Range—SBIR), and site front side least squares focal plane range (site flatness quality requirements—SFQR). (for definitions and calculations see, e.g., SEMI M1-1103, ASTM F657, ASTM F1390, ASTM F1530).

In addition to being flat, the substrates must also be smooth and free of mechanical damage on the surface. This requirement is mandatory, as part of the device fabrication process the substrate will be placed into a chemical vapor deposition epitaxy process, which is used to grow crystalline thin films. As the thin film grows, it replicates the crystal structure presented on the substrate's surface. Consequently, excessive roughness and mechanical damage on the substrate's surface would result in poor film quality.

The most common methods of producing flat and smooth substrates involve a sequential series of material cutting steps to gradually achieve a high level of flatness and low roughness. Each polishing step uses smaller and smaller abrasive particles to reduce the surface roughness to the target. Polishing pads with strategically chosen mechanical properties are chosen to control the "planarization length" which influences the final waviness of the substrate and achieve the local flatness objectives.

For example, in silicon substrate processing, wafers are sliced and then treated with a lapping or grinding process to make each face of the substrate parallel, achieving global flatness. But these processes result in a significant amount of mechanical damage to the surfaces of the substrate and can result in increased bow or warp of the substrate. To remove the damage, the silicon wafers are typically immersed in a chemical solution which is used to etch the surface damage. This process, generally referred to as saw damage removal, can render the substrate surface quite wavy, and subsequent flattening processes must be applied. Next, to bring the substrate to the targeted thickness range, a series of procedures known as stock removal are applied. In silicon processing, stock removal includes one or several polishing steps using chemical mechanical polishing processes which are used to efficiently reduce the thickness of the substrate to near the target thickness and reduce waviness. Next the wafer is further polished with finer abrasive chemical mechanical polishing processes, long planarization length polishing pads and with small removal targets, in order to achieve the required flatness and roughness specifications. While there are many steps, the duration of the process from lapping/grinding to completion is only several hours, and it can deliver silicon wafers having the flatness and roughness performance required to meet lithography targets, even after CVD (chemical vapor deposition) epitaxy layers are applied to the substrate.

Several publications describe methods to polish silicon wafers to achieve control of both global and local flatness. Most common among these methods for silicon wafers is a series of slicing, edge chamfering, lapping or grinding, etching, polishing, where the polishing steps are single or double side polishing—or both types used sequentially. Double side polishing is described in U.S. Pat. No. 3,691,694. U.S. Pat. No. 6,583,050 details methods used to achieve control of silicon wafer flatness which employ double side polishing.

However, due to its nature as a hard and chemically resistant material, cutting, grinding and polishing methods for single crystal SiC resort to use of diamond and metal carbide abrasives for the primary shaping of the substrates. The chemical properties of SiC are such that it is not practical to etch the substrate to remove gross cutting related surface damage. When silicon wafers are polished, methods of chemical mechanical polishing are used and the removal of material is very efficient since the polishing chemistry can oxides etch and abrade the wafer at the same time. It is not practical to employ chemical enhanced mechanical polishing on SiC since the chemical reaction rates are very slow and the costs associated with the process become very high.

The diamond abrasives required to process SiC are very costly compared to the standard abrasives that are used to polish silicon substrates. The SiC polishing times are quite long even with diamond abrasives—the material removal rates for SiC are 5-20 times slower than the corresponding silicon substrate process. In fact, SiC is the abrasive material used to cut and polish silicon wafers. Inefficient removal rates and expensive abrasives make the process to polish SiC extremely costly, especially when conventional strategies to produce flat wafers are applied to SiC.

In order to meet the commercial and economic requirements for acceptance of SiC semiconductor devices, innovative methods to polish SiC substrates must be developed. Efficient methods of cutting and polishing SiC substrates with minimum use of abrasives and minimum intermediate steps must be realized. The polishing process duration must be practical for high volume manufacturing. The overall performance of the polishing strategy must also achieve the wafer surface crystal quality benefits (smooth and free of damage) that would normally be obtained by bulk chemical etch procedures like that used in silicon polishing. Finally the polished substrate must be suitable for epitaxy processes and the final substrate with epitaxy layer must meet the flatness requirements associated with the photolithography steps needed in the fabrication of the electrical device.

U.S. Pat. No. 8,436,366 describes a method to prepare SiC wafers that will result in control of the wafer global flatness during epitaxy and device fabrication. The method consists of slicing the SiC wafer followed by double-side grinding to adjust the flatness, double-side lapping with diamond slurry to reduce the roughness, double-side mechanical polishing with diamond slurry to further reduce the roughness and single side chemical mechanical polishing. The method states a sequence of steps targeted to control the bow and warp of the wafer, but does not detail the interplay between the steps which impact the wafer flatness parameter or the impact of each step on the final wafer shape, only double-side processing is cited as the key element. The method does not disclose means to control local flatness metrics or resulting performance of local flatness/thickness metrics. With the inclusion of many different material removal steps the result will be high manufacturing costs. This polished wafer is designed to have a flatness performance that is offset that is to compensate for undesirable bending of the wafer which can occur during the steps to manufacture a semiconductor device.

The unexpected result of the present invention is that a silicon carbide wafer can be polished with good global AND local flatness and thickness using a simple method. The method requires a lapping OR sequential two side grinding step to establish a low value global and local flatness, and to set the thickness, and a double side polish step to reduce roughness to an acceptable value. A key feature of this invention is the use of large diameter lapping and polishing equipment to simultaneously control and maintain both local and global flatness. Wafer etching is not required to achieve flatness or thickness control, nor is it necessary to use etching to remove mechanical damage. Both the global and local flatness performance achieved on the polished wafer of this invention can be maintained following chemical mechanical polish steps used to reduce the RMS roughness to small values and alternatively, after a gas phase etch is performed and SiC epitaxy film layer is applied to the surface of the polished wafer. As a result of the polished wafer manufacturing strategy, the final epitaxy wafer has favorable global and local flatness performance which will result in better utility to manufacture semiconductor devices with large active area.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various embodiments provide methods for efficiently polishing an SiC wafer to achieve a surface free of mechanical damage and applying an epitaxial layer, and simultaneously delivering superior performance with respect to flatness. Without being bound by any theory, some disclosed methods are predicated on the discovery that the propagation of polishing damage from abrasives used on SiC follows a unique behavior. Strategic integration of SiC wafer polishing methods involving different abrasives, intermediate process targets and batch processing equipment with larger diameter lap/polish tables have been found to result in a cost efficient process meeting the process duration and quality goals suitable to sell the product within the power semiconductor industry.

In order to fabricate large area (>0.75 $cm^2$) power semiconductor devices in SiC, the substrate must be flat on both a local and global level after the epitaxial layer has been applied, as CVD epitaxy can degrade the thickness variation or flatness relative to the polished substrate. The polished substrate flatness depends on the complex interactions of several manufacturing steps (slice/lapping or grinding/polishing). It is also discovered that a synergistic result can be obtained with a judicious selection of interdependent steps to achieve the critical flatness and roughness targets using properly selected polishing equipment and abrasives.

According to aspects of the invention, a method for fabricating single crystal SiC wafers is provided, the method comprising the steps of: (i) slicing an ingot of single crystal SiC into a plurality of wafers, wherein each wafer conforms simultaneously to total thickness variation of less than 10 μm and warp of less than 35 μm; (ii) chamfering circumferential edge of each of the wafers of step (i); (iii) lapping the front and back surfaces of each of the wafers of step (ii); and (iv) double side polish of each wafer from step (iii); to thereby fabricate wafers having total thickness variation of 0.1-5 μm, warp between 0.1 and 35 μm, local thickness variation of 0.1-1.5 μm, and site front side least squares focal plane range, SFQR 0.01-0.3 μm, based on a one square cm site size. U.S. Pat. No. 8,436,366 does not disclose a process which will establish low values of global and local thickness variations and flatness on either polished wafers or polished wafers with epitaxial layers.

According to other aspects, a polished SiC wafer having a back surface and a front surface conditioned for epitaxial deposition is provided, wherein the front surface has rms roughness of Rq<15 Å. Due to the nature of the double side polishing process, the back surface has similar value of RMS roughness. Further, the wafer has total thickness variation (TTV) of 0.1-5 µm and local thickness variation (LTV) of 0.1-1.5 µm, based on a one square centimeter site size. Additionally, the wafer exhibits warp between 0.1 and 35 µm and site front side least squares focal plane range of 0.01-0.3 µm, based on a one square cm site size. When the polished wafer is used for epitaxial deposition of SiC layer on the front surface thereof, the wafer retains good global and local flatness and thickness performance.

In one aspect, provided herein is a substrate comprising a polished silicon carbide wafer having a back surface and a front surface, the front surface conditioned for epitaxial deposition, wherein the polished silicon carbide wafer has local thickness variation (LTV) of 0.1 to 1.5 µm and site front side least squares focal plane range (SFQR) of 0.01 to 0.3 µm, based on a one square cm site size.

In one embodiment of this aspect, the front surface has rms roughness of Rq<15 Å.

In another embodiment of this aspect, the substrate has a total thickness variation (TTV) in the range 0.1 to 5 µm.

In another embodiment of this aspect, the substrate further has warp of 0.1 to 35 µm.

In another aspect, provided herein is a single-crystal silicon carbide substrate comprising a back surface and a front surface, the front surface having an epitaxial layer of SiC grown thereupon, the substrate with the epitaxial layer exhibiting local thickness variation (LTV) of 0.1 to 1.8 µm and site front side least squares focal plane range (SFQR) of 0.01 to 0.45 µm, based on a one square cm site size.

In one embodiment of this aspect, the substrate with the epitaxial layer further simultaneously exhibiting total thickness variation (TTV) of 0.1 to 6 µm and warp of 0.1 to 40 µm.

In another embodiment of this aspect, the root mean square roughness value Rq of the front surface is less than 2 nm as measured on a 2.0×2.0 µm site size.

In another embodiment of this aspect, the substrate simultaneously exhibits total thickness variation (TTV) 0.1 to 5 µm, warp of 0.1 to 35 µm, local thickness variation (LTV) 0.1 to 1.5 µm, and site front side least squares focal plane range (SFQR) of 0.01 to 0.3 µm, based on a one square cm site size.

In another aspect, provided herein is a method for fabricating single-crystal silicon carbide wafers, comprising: (i) slicing an ingot of single crystal silicon into a plurality of wafers; (ii) chamfering circumferential edge of each of the wafers of step (i); (iii) performing saw damage removal from front and back surfaces of each of the wafers of step (ii); and (iv) simultaneous polishing of both surfaces of each wafer of step (iii); to thereby fabricate wafers having local thickness variation (LTV) of 0.1 to 1.5 µm and site front side least squares focal plane range (SFQR) of 0.01 to 0.3 µm, based on a one square cm site size.

In one embodiment of this aspect, in step (i), each wafer conforms simultaneously to total thickness variation (TTV) of less than 10 µm and warp of less than 35 µm.

In another embodiment of this aspect, to thereby fabricate wafers having total thickness variation (TTV) of 0.1 to 5 µm, warp of 0.1 to 35 µm, and local thickness variation (LTV) of 0.1 to 1.5 µm, based on a one square cm site size.

In another embodiment of this aspect, the step of saw damage removal is performed using a lapping tool having surface of diameter at least three times larger than diameter of the wafer.

In another embodiment of this aspect, the substrate slices are lapped on a two sided lapping machine with table diameter at least three times larger than the diameter of the wafer.

In another embodiment of this aspect, where following slicing the substrates are processed using a single wafer, diamond wheel grinder, one side at a time.

In another embodiment of this aspect, the step of polishing is performed using a polishing tool having surface of diameter at least three times larger than diameter of the wafer.

In another embodiment of this aspect, the step of polishing is performed by placing the wafers in stainless steel carriers.

In another embodiment of this aspect, the step of polishing is performed so as to remove 25% as much SiC as was removed in the step of saw damage removal.

In another embodiment of this aspect, the method further comprises applying chemically enhanced mechanical polishing to the front surface.

In another embodiment of this aspect, the step of applying chemically enhanced mechanical polishing is performed using a polisher with diameter greater than three times the wafer diameter.

In another embodiment of this aspect, the method further comprises etching the front surface of the wafer in a CVD chamber using a gas mixture containing hydrogen and/or chlorine gases at temperature greater than 1300° C.

In another embodiment of this aspect, the method further comprises treating the front surface with a chemical enhanced mechanical polish and/or a high temperature gas phase etch, and thereafter depositing an epitaxial layer of SiC on the front surface.

In another embodiment of this aspect, the step of saw damage removal is performed so as to remove 60 to 85 µm of SiC material from each wafer, and the polishing step is performed so as to remove a quarter of the amount of SiC material removed during the saw damage removal step.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

In the drawings, where like reference numerals refer to like features in the specification:

FIG. 1 is a flow chart illustrating the general steps of a method for fabricating SiC wafers according to an embodiment of the invention.

DETAILED DESCRIPTION

It should be understood that this invention is not limited to the particular methodology, protocols, etc., described herein and as such may vary. The terminology used herein is for the purpose of describing particular embodiments only, and is not intended to limit the scope of the present invention, which is defined solely by the claims.

As used herein and in the claims, the singular forms include the plural reference and vice versa unless the context clearly indicates otherwise. Other than in the operating examples, or where otherwise indicated, all numbers expressing quantities used herein should be understood as modified in all instances by the term "about."

All publications identified are expressly incorporated herein by reference for the purpose of describing and disclosing, for example, the methodologies described in such publications that might be used in connection with the present invention. These publications are provided solely for their disclosure prior to the filing date of the present application. Nothing in this regard should be construed as an admission that the inventors are not entitled to antedate such disclosure by virtue of prior invention or for any other reason. All statements as to the date or representation as to the contents of these documents is based on the information available to the applicants and does not constitute any admission as to the correctness of the dates or contents of these documents.

Unless defined otherwise, all technical and scientific terms used herein have the same meaning as those commonly understood to one of ordinary skill in the art to which this invention pertains. Although any known methods, devices, and materials may be used in the practice or testing of the invention, the methods, devices, and materials in this regard are described herein.

Some Selected Definitions

Unless stated otherwise, or implicit from context, the following terms and phrases include the meanings provided below. Unless explicitly stated otherwise, or apparent from context, the terms and phrases below do not exclude the meaning that the term or phrase has acquired in the art to which it pertains. The definitions are provided to aid in describing particular embodiments of the aspects described herein, and are not intended to limit the claimed invention, because the scope of the invention is limited only by the claims. Further, unless otherwise required by context, singular terms shall include pluralities and plural terms shall include the singular.

As used herein the term "comprising" or "comprises" is used in reference to compositions, methods, and respective component(s) thereof, that are essential to the invention, yet open to the inclusion of unspecified elements, whether essential or not.

As used herein the term "consisting essentially of" refers to those elements required for a given embodiment. The term permits the presence of additional elements that do not materially affect the basic and novel or functional characteristic(s) of that embodiment of the invention.

The term "consisting of" refers to compositions, methods, and respective components thereof as described herein, which are exclusive of any element not recited in that description of the embodiment.

Other than in the operating examples, or where otherwise indicated, all numbers expressing quantities used herein should be understood as modified in all instances by the term "about." The term "about" when used in connection with percentages may mean ±1%.

The singular terms "a," "an," and "the" include plural referents unless context clearly indicates otherwise. Similarly, the word "or" is intended to include "and" unless the context clearly indicates otherwise. Thus for example, references to "the method" includes one or more methods, and/or steps of the type described herein and/or which will become apparent to those persons skilled in the art upon reading this disclosure and so forth.

Although methods and materials similar or equivalent to those described herein can be used in the practice or testing of this disclosure, suitable methods and materials are described below. The term "comprises" means "includes." The abbreviation, "e.g." is derived from the Latin exempli gratia, and is used herein to indicate a non-limiting example. Thus, the abbreviation "e.g." is synonymous with the term "for example."

To the extent not already indicated, it will be understood by those of ordinary skill in the art that any one of the various embodiments herein described and illustrated may be further modified to incorporate features shown in any of the other embodiments disclosed herein.

The following examples illustrate some embodiments and aspects of the invention. It will be apparent to those skilled in the relevant art that various modifications, additions, substitutions, and the like can be performed without altering the spirit or scope of the invention, and such modifications and variations are encompassed within the scope of the invention as defined in the claims which follow. The following examples do not in any way limit the invention.

The following provides examples of fabrication methods according to embodiments of the invention, which result in substrates suitable for photolithographic-based device fabrication. The various methods provide substrates having the required specifications of bow, warp, total thickness variation, local thickness variation, and site front side least squares focal plane range.

Embodiments for producing SiC wafers follow the general process outlined here and illustrated in FIG. 1. In step 100 an SiC ingot is obtained. SiC ingots are typically grown using a sublimation process. The ingot can be cropped (not shown) to obtain the general shape desired, e.g., a cylinder having a circular or square cross-section. In step 105 the ingot is sliced into thin wafers. Then, in step 110 the circumferential edge of each wafer is chamfered. As is known, slicing of the ingot causes surface and sub-surface damage to the cut wafers. In this embodiment, a lapping or grinding process is used in step 115 to remove a certain thickness, e.g., 50-100 microns, from working on both surfaces of the wafer, thereby removing the slicing damage and flattening the wafer in one step. The lapping is followed by a double-side polishing process in step 120. After polishing the wafers are ready for epitaxial growth in step 125; however, optionally the surface used for epitaxial growth can be further smoothed using chemical mechanical polishing (CMP) in step 130, prior to the epitaxial growth of step 125.

An example will now be provided with more specificity. As before, the example starts with the slicing of the SiC crystal. As SiC is much harder than silicon (SiC is 9.5 on Mohs hardness scale, while Si is 7), slicing of an SiC ingot requires modifying the standard silicon slicing methods. For example, SiC slurry, which is generally used for slicing silicon ingots, cannot be used for slicing SiC ingots. Instead, a diamond slurry must be used (diamond is 10 on Mohs hardness scale). A fixed abrasive diamond wire has also been investigated, such that no diamond slurry is needed. However, in this particular example, the slicing is performed using a multi-wire saw and diamond slurry, configured to deliver slices conforming simultaneously to TTV of 10 μm or less and warp of 35 μm or less. The slicing parameters of slice rate, abrasive size and flow are commonly adjusted to minimize the formation of slice marks on the surface of the slices. Specifically, it is found that when the TTV exceeds 10 μm the correction of this value in later process steps leads to undesirable expense. Therefore, the slicing parameters are tuned to deliver TTV<10 μm during the slicing process.

Next, the wafer edge is chamfered. This is done prior to lapping in order to avoid chipping at the circumference of the wafer or cracking during the lapping. Chamfering of silicon wafers is disclosed in, for example, U.S. Publication 2009/0324896; however, in this invention the chamfering is done using a diamond grinding wheel (to account for the hardness of SiC) with a trapezoidal groove shape.

Saw damage removal is done by lapping or grinding. A conventional lapping machine is disclosed in, for example, U.S. Pat. No. 4,582,561. However, it is found that to properly use lapping and polishing for current size SiC wafers (76-150 mm), lapping and polishing equipment with diameter greater than 20 inches (about 500 mm) is required. That is, the lapping and polishing tools' surface should be at least three times the diameter of the SiC wafer in order to control both the global and local wafer thickness and flatness.

As noted, lapping is used for saw damage removal, as slicing can result in a wavy surface—here lapping is used to make the wafer flat and surfaces parallel. In one example, a double-sided diamond abrasive lap machine of diameter greater than 20 inches is used to remove material simultaneously on both sides of the sliced wafer. The mean diamond particle size range for this step is 4-12 µm. Alternatively, a diamond wheel grind is applied sequentially to each side to remove material on each side of the sliced wafer. The typical diamond abrasive size used on the grind wheel is typically from 500-2000 mesh (about 25-5 µm). Typical net removal target, from both surfaces of the wafer, using either method is from 60 to 85 µm. The amount removed from both surfaces is generally even, such that about 30-45 µm is removed from each surface. The amount removed must eliminate the surface damage and slicing marks of the slicing process, and can typically be achieved in less than one hour. The TTV and warp of the processed wafers must be smaller than the incoming post slice value.

A stock polish process step follows the saw damage removal step. A double sided diamond slurry polish process is performed on a machine of diameter greater than 20 inches to remove the mechanical surface damage material from both sides of the lapped/grinded wafer and the thickness is reduced to approximately the targeted value. The wafers are placed in stainless steel carriers, since the diamond slurry would erode standard Polytetrafluoroethylene (PTFE) carriers. The stock polish step can be performed in one step or separated into several steps with slurries having different mean particle size distribution in order to maximize efficiency of removal and achieve the desired final surface roughness. The typical amount of material removed is about 25% that of the lapping step. The process time is typically 2-4 hours depending on the particles sizes of the abrasives used. The best results are obtained when the last polish step is conducted using a diamond slurry with median particle size, ranging from 0.45-0.55 µm, resulting in a mirror-like surface.

It has been discovered that this integrated process will deliver a polished wafer which has a mirror-like surface. The wafer obtained from the above example satisfies all of the specifications: rms roughness Rq 10-15A on both the pre-epitaxy wafer face and opposite wafer face, TTV<5 µm, LTV<1.5 µm, SFQR<0.3 µm, all for site size 1×1 cm$^2$. This wafer can be used in epitaxy if a pre-epitaxy, gas phase high temperature surface etch step is applied before CVD growth to globally remove the remaining mechanical subsurface damage, typically corresponding to 0.5-2.0 nm of etching. For example, the etching can be performed using a gas mixture containing hydrogen and orhalogen containing gases at temperature greater than 1300° C.

Alternatively, the side of the wafer targeted for epitaxy can be further polished using a chemical-enhanced mechanical polishing process (chemical oxidation) which can be, for example, an alumina or silica abrasive in a solution which oxidizes the wafer surface as it is eroded. Less than 1 µm is removed and the subsurface damage is nearly eliminated. Following the embodiments of the invented method, the flatness metrics associated with the wafer are essentially unchanged after this step (less than +/−10%), while the roughness value, Rq, is below 0.5 nm on the face polished using chemical mechanical polishing.

SiC epitaxy is then deposited on the wafer. Any standard technologies known by those skilled in the art for the growth of SiC by chemical vapor deposition can be applied. The epitaxial deposition can be tuned at the CVD tool using temperature uniformity, pressure and flow, so that the wafer TTV and LTV remain essentially unchanged (less than +/−20%). The final wafer exhibits limited or no step bunching on the epitaxy surface due to the flatness of the starting polished wafer.

EXAMPLE 1

The process flow disclosed above and illustrated in FIG. 1, was employed to fabricated 4H-SiC wafers of 75 mm and 100 mm diameters. The wafers exhibited resistivity range of 0.015-0.028 ohm cm. For steps 100-105-110, SiC ingots were machined into right cylinders. The cylindrical ingots were mounted on a plastic beam and placed into a multiwire saw. The ingots were cut using wire and a flow of diamond slurry directed onto the periphery of the ingot. The beam was removed from the saw and based into a bath to separate the slices from the beam. The slices were rinsed and placed into a cassette. The wafers were transferred to an automated edge grinding system where a trapezoidal edge profile was formed using a diamond wheel. The process follows the guidelines of SEMI Standard M55.

For step 115, saw damage removal was conducted using lapping or grinding, as indicated. Lapping was performed simultaneously on both wafer sides using lapping machine with diameter >40 inches. Wafers were placed into several stainless steel carriers located on the lapping table. The table was made of iron and slurry containing diamond particles was directed onto the table surface while the carriers were rotated between lapping plates. In a separate effort, grinding was performed using single wafer process and sequentially grinding each side of the wafer using a bonded diamond grinding wheel instead of lapping. After material was removed from the wafers, in either case, the wafers were washed and rinsed.

Step 120, polishing, was performed simultaneously on both wafer sides using polishing machine with diameter >40 inches. Urethane polishing pads covered the polishing table top and bottom plates. Wafers were placed into several stainless steel carriers located on the polishing table. Polishing slurry containing diamond particles was directed onto the table surface during the polishing process, while the carriers were rotated between polishing plates. After material was removed from the wafers, the wafers were washed and rinsed.

For samples processed using step 130, CMP polish, wafers were placed into one of several pockets formed from plastic carriers which were connected to one of three polishing heads on a single side polishing system with diameter larger than 20 inches. Each polishing head can hold several wafers depending on wafer diameter. A urethane cloth was placed on the polishing table. The polishing heads were lowered onto the table and the table rotated and polishing slurry with oxide abrasive particles was directed onto the table while the table rotated.

For samples processed using step 125, epitaxy, CVD films of SiC were deposited on polished wafers using a batch CVD system. Wafers were placed onto a graphite susceptor and into the vacuum chamber. The chamber was pumped to vacuum and the susceptor was heated using RF induction heating to temperature above 1500° C. First, a mixture of gases containing hydrogen and hydrogen chloride was fed to the chamber to etch the surface of the wafers. The system was evacuated and filled to the process pressure with hydrogen. A mixture of nitrogen, silicon and carbon gases was introduced to the chamber to form the film. The final film thickness was 10 µm and the film doping was in the range of 3-6×10$^{16}$/cm$^3$.

Testing of SiC substrate wafers has been performed using an MTI Instruments Incorporated AutoScan 200 measurement system. This is a capacitance based wafer shape test with calculations aligned with ASTM/SEMI standards (TTV ASTM/SEMI F533, bow ASTM/SEMI F534, warp ASTM/SEMI F1390 and flatness ASTM/SEMI F1530-02). The site size for the SBIR and SFQR measurement was 1×1 cm. Roughness was evaluated using a Digital Instruments Inc. atomic force microscope in tapping mode. A 2×2 micrometer site in the center of the wafer was evaluated. It is noted that U.S. Pat. No. 8,436,366 does not use the same measurement protocol to measure TTV, the figures in U.S. Pat. No. 8,436,366 show a back side referenced, or chucked, measurement while the TTV measurements reported in this work are based on a floating substrate. As a result the comparison of TTV values between this invention and U.S. Pat. No. 8,436,366 is not direct.

Table 1 lists the measurements of flatness of 76 mm diameter polished SiC wafer. For this wafer, saw damage removal was done with lapping and polishing was processed thru the chemical mechanical polish step.

| Measurement | Value (microns) |
|---|---|
| Center Thickness | 399.1 |
| Average Thickness | 398.6 |
| Minimum Thickness | 397.6 |
| Maximum Thickness | 399.3 |
| TTV | 1.7 |
| Bow | 0.5 |
| Warp | 23.3 |
| SORI | 15.8 |
| GBIR | 1.7 |
| Maximum SFQR | .17 |
| Maximum SBIR | 0.51 |
| RMS Roughness AFM (2 × 2 µm site) | 0.072 × 10$^{-3}$ |

Table 2 lists the measurements of flatness of 100 mm diameter polished SiC wafer. For this wafer, saw damage removal was done with grinding and polishing was processed thru the stock polish step.

| Measurement | Value (microns) |
|---|---|
| Center Thickness | 358.8 |
| Average Thickness | 358.41 |
| Minimum Thickness | 357.8 |
| Maximum Thickness | 358.9 |
| TTV | 1.05 |
| Bow | −9.3 |
| Warp | 15.6 |
| SORI | 15.3 |
| GBIR | 1.05 |
| Maximum SFQR | 0.20 |
| Maximum SBIR | 0.88 |
| RMS Roughness AFM (2 × 2 µm site) | 0.741 × 10$^{-3}$ |

Table 3 lists measurements of flatness of 76 mm diameter SiC wafer with 10 µm epitaxial film. For this wafer, saw damage removal was done with grinding, and polishing was processed thru the stock polish step.

| Measurement | Value (microns) |
|---|---|
| Center Thickness | 372.1 |
| Average Thickness | 371.9 |
| Minimum Thickness | 371.4 |
| Maximum Thickness | 372.2 |
| TTV | 0.79 |
| Bow | −7.30 |
| Warp | 15.2 |
| SORI | 14.2 |
| GBIR | 0.79 |
| Maximum SFQR | 0.21 |
| Maximum SBIR | 0.58 |

Table 4 lists the measurements of flatness of 100 mm diameter SiC wafer with 10 µm epitaxial film. For this wafer, saw damage removal was done with grinding, and polishing was processed thru the stock polish step.

| Measurement | Value (microns) |
|---|---|
| Center Thickness | 372.7 |
| Average Thickness | 372.9 |
| Minimum Thickness | 372.6 |
| Maximum Thickness | 373.3 |
| TTV | 0.73 |
| Bow | −2.85 |
| Warp | 15.6 |
| SORI | 10.0 |
| GBIR | 0.73 |
| Maximum SFQR | 0.23 |
| Maximum SBIR | 0.38 |

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A method for fabricating single-crystal silicon carbide wafers, comprising:
   (i) slicing an ingot of single crystal silicon into a plurality of wafers;
   (ii) chamfering circumferential edge of each of the wafers of step (i);
   (iii) performing saw damage removal from front and back surfaces of each of the wafers of step (ii); and
   (iv) simultaneous polishing of both surfaces of each wafer of step (iii); to thereby fabricate wafers having local thickness variation (LTV) of 0.1 to 1.5 µm and site front side least squares focal plane range (SFQR) of 0.01 to 0.3 µm, based on a one square cm site size.

2. The method of claim 1, wherein, in step (i), each wafer conforms simultaneously to total thickness variation (TTV) of less than 10 µm and warp of less than 35 µm.

3. The method of claim 1, to thereby fabricate wafers having total thickness variation (TTV) of 0.1 to 5 μm, warp of 0.1 to 35 μm, and local thickness variation (LTV) of 0.1 to 1.5 μm, based on a one square cm site size.

4. The method of claim 1, wherein the step of saw damage removal is performed using a lapping tool having surface of diameter at least three times larger than diameter of the wafer.

5. The method of claim 3 wherein the substrate slices are lapped on a two sided lapping machine with table diameter at least three times larger than the diameter of the wafer.

6. The method of claim 3 where following slicing the substrates are processed using a single wafer, diamond wheel grinder, one side at a time.

7. The method of claim 1, wherein the step of polishing is performed using a polishing tool having surface of diameter at least three times larger than diameter of the wafer.

8. The method of claim 5, wherein the step of polishing is performed by placing the wafers in stainless steel carriers.

9. The method of claim 6, wherein the step of polishing is performed so as to remove 25% as much SiC as was removed in the step of saw damage removal.

10. The method of claim 1, further comprising applying chemically enhanced mechanical polishing to the front surface.

11. The method of claim 8, wherein the step of applying chemically enhanced mechanical polishing is performed using a polisher with diameter greater than three times the wafer diameter.

12. The method of claim 1, further comprising etching the front surface of the wafer in a CVD chamber using a gas mixture containing hydrogen and/or chlorine gases at temperature greater than 1300° C.

13. The method of claim 1, further comprising treating the front surface with a chemical enhanced mechanical polish and/or a high temperature gas phase etch, and thereafter depositing an epitaxial layer of SiC on the front surface.

14. The method of claim 1, wherein the step of saw damage removal is performed so as to remove 60 to 85 μm of SiC material from each wafer, and the polishing step is performed so as to remove a quarter of the amount of SiC material removed during the saw damage removal step.

* * * * *